United States Patent [19]

Lebby

[11] Patent Number: 5,045,908
[45] Date of Patent: Sep. 3, 1991

[54] VERTICALLY AND LATERALLY ILLUMINATED P-I-N PHOTODIODE

[75] Inventor: Michael S. Lebby, Chandler, Ariz.

[73] Assignee: Motorola, Inc., Schaumburg, Ill.

[21] Appl. No.: 587,840

[22] Filed: Sep. 25, 1990

[51] Int. Cl.$^5$ ............................................. H01L 27/14
[52] U.S. Cl. ......................................... 357/30; 357/58; 357/55; 357/56; 357/16; 357/19
[58] Field of Search ................. 357/30 P, 30 L, 30 D, 357/30 R, 16, 58, 19, 55, 56

[56] References Cited

FOREIGN PATENT DOCUMENTS

| 0039020 | 11/1981 | European Pat. Off. | ........... 357/30 L |
| 60-244077 | 12/1985 | Japan | .................................. 357/30 L |
| 62-209872 | 9/1987 | Japan | .................................. 357/30 L |
| 63-90866 | 4/1988 | Japan | .................................. 357/30 L |
| 2164492 | 3/1986 | United Kingdom | ............. 357/30 L |

OTHER PUBLICATIONS

No Author, "Vertically Emitting Diode Laser with Integrated Front-Beam Monitor Photodiode," *IBM Technical Disclosure Bulletin*, vol. 32, No 8A, Jan. 1990, pp. 149-150.

*Primary Examiner*—William Mintel
*Attorney, Agent, or Firm*—Joe E. Barbee

[57] ABSTRACT

A method for improving efficiency of a p-i-n photodetector by having a reflector (14) reflect incident light into a receptor area (11). Receptor area (11) is increased in functional size by using reflector (14) to reflect light into the side of receptor area (11). Reflector (14) can be configured so as to act as a filtering or focusing means.

11 Claims, 1 Drawing Sheet

VERTICALLY AND LATERALLY ILLUMINATED P-I-N PHOTODIODE

BACKGROUND OF THE INVENTION

This invention relates, in general, to photodetectors, and more particularly, to p-i-n photodiodes having increased absorption efficiency of incident light.

P-i-n photodiodes have been designed in either a vertical or a horizontal configuration. Vertically configured p-i-n photodiodes or photodetectors have been successfully manufactured for a number of years. However horizontally configured p-i-n photodiodes have only been demonstrated in a research environment.

Utilization of vertical high band-gap p-i-n photodiodes as components in discrete form or part of a monolithic process is important for optical transmission systems operating in a range of 10 giga bits per second. Bandwidths of these devices at long wavelengths, 1.3 to 1.55 micrometers, have achieved a 3 decibel bandwidth up to a frequency of 67 gigahertz using a mesa structure for vertical illumination with an indium gallium arsenide absorbing region lattice matched and epitaxially grown on an indium phosphide substrate. Increasing performance demands have been predicted with frequency values as high as 200 gigahertz. However, this performance level has not yet been achieved.

As increasing performance demands and smaller size restrictions are made on vertical p-i-n photodiodes several problems occur. Bandwidth, quantum efficiency, and fiber optic alignment are three examples of problems caused by increasing performance demands. Bandwidth and quantum efficiency are both effected by device design, structure, and conventional manufacturing techniques. Usually, as a broader bandwidth is required, quantum efficiency decreases in vertically configured p-i-n photodiodes. Also, as photodetector devices get smaller in size to attain higher performance it is more difficult to align fiber optics to the photodetector.

P-i-n photodiodes consist of a simple circular mesa structure that has been successfully used in long wavelength optical communication systems in a discrete form, as well as, in the shorter wavelength region (0.5-1.2 microns). The p-i-n photodiode has been able to achieve high reliability, hybrid integration with low voltage amplifiers, low noise levels, and low leakage currents.

Horizontally illuminated p-i-n photodiodes have shown some promise for high performance photodetectors but, have severe fiber optic alignment problems. These photodiodes are illuminated from a side facet with extremely high precision fiber optics. The alignment of fiber optics for horizontal photodiodes is very difficult to achieve and expensive to do. The high precision required to align fiber optics to a horizontal photodiode prohibits using this type of photodetector, and this has restricted this type of device to the research laboratory.

It is evident that conventional methods of manufacturing p-i-n photodiodes have severe limitations as performance levels increase. Therefore, a method for improving performance of vertical p-i-n photodiodes by increasing bandwidth, quantum efficiency, and fiber optic alignment tolerances would be highly desirable.

SUMMARY OF THE INVENTION

The objects and advantages of the present invention are provided by a method for improving efficiency of a p-i-n photodiode device by creating reflectors to direct incident light toward a receptor area. Incident light is reflected or focused toward the receptor area. Alignment tolerances for fiber optics are increased by improving light gathering capabilities. The reflector is integrated with the photodiode itself.

DETAILED DESCRIPTION OF THE DRAWINGS

Figure 1:
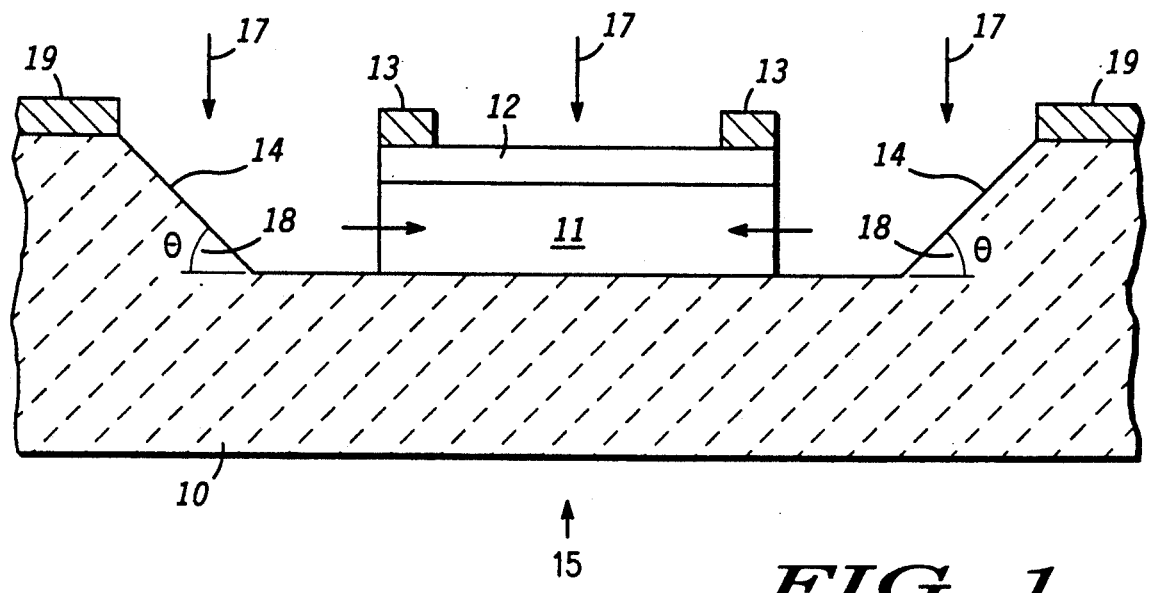
FIG. 1 is an enlarged cross-sectional view of a vertical p-i-n photodiode with reflectors in accordance with the present invention.

FIG. 1 is an enlarged cross-sectional view of a vertical p-i-n photodiode 15 with reflector 14 to direct incident light or photons illustrated by arrows 17 toward receptor or intrinsic area 11. A p-i-n photodiode or photodetector 15 is a semiconductor p-n junction with an impurity doping profile tailored so that an undoped intrinsic layer or receptor area 11, lays between a p-layer 12 and a n-layer 10. P-layer 12 and n-layer 10 can be interchanged so that a n-i-p photodiode is fabricated. It should be understood that photodiodes 15 are typically circular in design but, can be designed to form other geometric shapes. Incident light 17 is directed toward p-i-n photodiode 15 by several well known means to those knowledgeable in the art. Incident light 17 strikes contact 13, p-type surface layer 12, and reflector 14. Reflector 14 is of a material that will not absorb incident light 17. Incident light 17 is absorbed in intrinsic or receptor area 11 after passing though layer 12 and after being reflected from reflector 14. The distance of reflector 14 from intrinsic area 11 can range from zero microns to any number of microns.

Contact 13 is a p-type ohmic contact that is a transparent circular ring which is comprised of indium tin oxide or the like. Indium tin oxide has the properties of being ohmic, as well as, optically transparent to incident light 17. Contact 13 when composed of a transparent film can completely cover layer 12 thereby acting as a transparent ohmic contact. Contact 13 could also be comprised of metal. It should be understood that contact 13 is a circular ring and that some of the ring is not shown in the cross-sectional view. Contact 13 is one of two connections where an electric field is applied to the photodetector.

Contact or electrode 19 forms a second ohmic contact for photodetector 15. Contact 19 is any suitable conductive material such as gold germanium, nickel and gold, aluminum or the like. It should be understood that contact 19 can be placed anywhere that is convenient to make electrical contact with substrate 10.

Layer 12 is comprised of a transparent layer whose energy band-gap is wider than receptor 11, such as indium phosphide, silicon, gallium arsenide, or the like. The large band-gap of layer 12 allows for photons or light 17 to pass though layer 12 without absorption and enter receptor area 11. It should be understood that it is common practice to deposit an anti-reflective (AR) coating on where incident light 17 enters layer 12.

Receptor area 11 is generally a circular mesa made from gallium arsenide, indium gallium arsenide, silicon, silicon germanium, or the like in which the energy band-gap is narrower than layer 12. Photons that enter intrinsic or receptor area 11 are absorbed and generate electron-hole carrier pairs from an applied electric field. This generation of electron-hole carrier pairs is measured and quantified as a percent efficiency number. The efficiency of generating electron-hole carrier pairs from photons is called quantum efficiency. By way of example, if all the photons that enter receptor area 11 generate electron-hole carrier pairs or none of the photons generate electron-hole carrier pairs a quantum efficiency of 100 percent or 0 percent is given, respectively, in each case. High quantum efficiencies are obtainable at bandwidths below 20 gigahertz due to a long absorption length or a thicker receptor area 11. However, as bandwidth increases, other design constraints such as device size, capacitance, transit time, and fiber alignment become more stringent, the quantum efficiency drops. Additionally, to optimize the photodiode for speed, capacitance must be kept to a minimum, which requires the photodetector to be small. An additional compounding factor for increasing speed is that receptor area 11 becomes thinner so that electron hole carrier pairs can be swept via a high electric field to their attracting electrodes 13 and 19 which reduces transit time. Unfortunately, as the receptor area 11 thins, vertically incident photons 17 are not completely absorbed and quantum efficiency falls, with a proportional reduction in current level at electrodes 13 and 19. These problems are reduced by using reflector 14 to direct incident light 17 into receptor area 11. Light that is directed from reflector 14 and strikes intrinsic layer 11 on its side has a greater probability of generating electron-hole carrier pairs. This greater probability is caused by a virtual increase in absorption length. The virtual increase in absorption length is caused by having incident photons 17 reflected from reflector 14 into receptor area 11 on its sides. This then allows for incident light 17, that is reflected from reflector 14, to travel a greater length across the diameter and therefore have a greater probability of being absorbed in receptor area 11.

Incident light 17 that strikes reflector 14 is reflected towards receptor area 11. It should be understood that reflector 14, in this example, surrounds receptor area 11 and that some of reflector 14 is not shown in the cross-sectional view. Reflector 14 is fabricated in such a manner so that acute angle 18 is formed that reflects incident light 17 toward receptor area 11. In a preferred embodiment, a nominal angle of 45 degrees to receptor area 11 is desired. Light that is reflected from reflector 14 is directed toward receptor area 11 and is consequently absorbed by receptor area 11. Photons reflected from reflector 14 add to a total amount of photons that are capable of being absorbed by receptor area 11. Conventional vertical and horizontally configured p-i-n photodetectors would not be able to collect the photons that do not impinge on p-type layer 12 because there was no method of capturing, directing, and subsequently absorbing those photons in receptor area 11. Light that is reflected from reflector 14 therefore adds to the total number of photons that are available to be absorbed. Additionally, it should be understood that as higher performance is required and receptor area 11 thins and circumference of receptor area 11 gets smaller, reflecting light or photons at the sides of receptor area 11 increases quantum efficiency of the photodiode. This increase in quantum efficiency is due to a virtual increase in absorption length.

Reflector 14 can be made so that it is curved. Curving reflector 14 focuses light 17 that is reflected from curved reflector 14 so that a more intense light is formed on a specific area of receptor area 11 or on a smaller receptor area 11.

Reflectors 14 are made so that there is either a change of refractive index or a change of medium which allows for reflection of light. Materials or coatings for this purpose can be ceramic, aluminium, metalloids, or the like. Also n-layer 10 can be etched to serve as a reflective surface 14. Care must be used however, when combining electrically conductive materials for coating reflector 14 with semiconductor substrates. It should be understood that shorting electrode 19 and 13 together would cause the photodetector to fail.

Reflector coatings can be used as a means to filter light that is reflected into receptor area 11. Different materials possess unique abilities to allow or restrict transmission of different wavelengths of light. Using different materials such as sapphire, silicon dioxide, or the like, for coating reflector 14 causes a filtration of light wavelengths that will be reflected into receptor area 11. This in effect will allow reflector 14 to become a wavelength filter.

Using reflector 14 in a p-i-n photodiode allows for larger alignment tolerances of an optical fiber which can supply light 17. Reflector 14 allows for light 17 to enter the photodiode at angles other than perpendicular. Reflector 14 also supplies a larger area to be targeted for by light 17. Additionally, light 17 which would have normally been wasted by falling outside of the alignment of layer 12 and receptor area 11 in conventional p-i-n photodiodes is gathered and efficiently used by the present invention.

Substrate 10 is an n-type layer. Substrate 10 is typically silicon, gallium arsenide, indium phosphide, or the like. The use of these materials permits epitaxial lattice matched receptor area 11 p-layer 12 and substrate 10 to be grown as a single structure. Additionally, another layer can be formed under substrate 10 that is composed of non-metalloid semiconductor materials such as glass, diamond, plastic, polymer or the like. Techniques such as epitaxial lift off are used to atomically bond substrate 10 to this non-metalloid substrate. This allows for easier methods of packaging and mounting of p-i-n photodetector 15.

Figure 2:
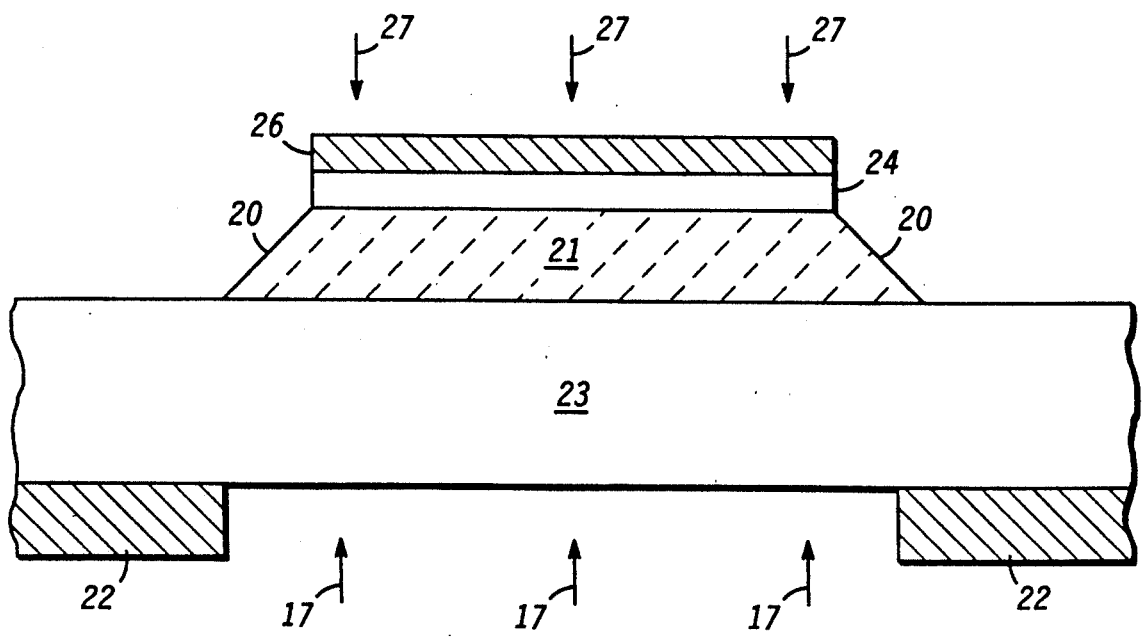
FIG. 2 is an enlarged cross-sectional view of an inverted vertical p-i-n photodiode with additional receptor area and built in reflector.

FIG. 2 is a cross-sectional view of an inverted p-i-n photodiode with reflector 20 and an increased receptor or intrinsic area 21. Light or photons 17 enter the p-i-n photodiode from the bottom and is reflected into increased receptor area 21 by reflector 20. Additionally, incident light 27 can enter from the top; however, in such a case, the advantages of reflector 20 are not utilized.

Contact 22 is a circular ring which is made from any suitable conductive material such as germanium, nickel gold, or the like. It should be understood that contact 22 is a circular ring and that some of contact 22 is not shown in this cross-sectional view. Contact 22 can be placed anywhere on substrate 23. It should be further understood that when contact 22 is made from an incident light transparent material such as indium tin oxide, a complete layer can be formed for contacts 22, and such a configuration causes a more uniform electric field across receptor area 20.

Light 17 strikes and passes though substrate 23. Substrate 23 is an n-type substrate made of a wide band-gap material that allows light 17 to pass though it. Substrate 23 is made from silicon, gallium arsenide, or the like, having a band-gap which is large enough for substrate 23 to be transparent to light 17. It should be further understood that it is a common practice to deposit an anti-reflective (AR) coating where incident light 17 or 27 first enters the p-i-n photodetector device.

Once light 17 has passed though substrate 23, light 17 enters receptor area 21 where it is absorbed. Absorption of light 17 is dependent upon absorption length in receptor area 21. Receptor area 21 absorption length has been increased by extending out receptor area 21, as shown in FIG. 2, to reflector 20. Therefore, as a result of increasing receptor area 21 in this manner reflected light or photons from reflector 20 have a greater probability of generating electron-hole carrier pairs.

Layer 24 is a p-doped semiconductor layer such as silicon, gallium arsenide, indium phosphide or the like, that provides an ohmic contact to receptor area 21. Layer 24 is transparent to incident light 17. Layer 24 can also act as a reflector if a material is used that also is electrically conductive from the receptor area 21 to contact 26, Contact 26 is formed on top of layer 24. Contact 26 forms a second electrical contact for the photodetector. Contact 26 is typically made from several materials such as titanium, platinum and gold, aluminium, or the like. Contact 26 can also be made out of indium tin oxide if incident light 27 is available to be absorbed in receptor region 21.

By now it should be appreciated that there has been provided a method for improving efficiency of p-i-n photodiodes. Use of a reflector allows for improved efficiency of a p-i-n photodetector by better utilization of incident light 17. Focusing and filtering of incident light 17 is also achievable. Additionally, greater latitude for fiber optic alignment is realized.

I claim:

1. A method for improving efficiency of p-i-n photodiode device comprising:
   providing a reflector on the photodiode device to direct incident light into a receptor area so reflected light travels into and in a parallel direction to the receptor area and along the length of the receptor area of the photodiode device.

2. The method of claim 1 further including directing light by using a planar angled reflector surface.

3. The method of claim 1 further including directing light by using a curved reflector.

4. The method of claim 1 further including increasing absorption length of the reflector area by reflecting the incident light into sides of the receptor area.

5. A method for focusing incident light into a receptor area of a p-i-n photodiode comprising:
   providing a substrate of a first conductivity type having a top surface and a bottom surface;
   providing a receptor area located on the top surface and having a first end and a second end;
   covering the receptor area with a layer of a second conductivity type and leaving the first and second ends exposed; and
   reflecting the incident light from a reflector located on the photodiode into at least the first end of the receptor area.

6. A method for improving alignment tolerances of a light source to a p-i-n photodetector comprising:
   providing a reflective surface on the photodetector that increases light gathering capabilities by gathering light that would otherwise avoid impinging on a receptor area of the photodetector; and
   reflecting light from the reflective surface into and parallel to the receptor area to increase the light gathering capabilities of the photodetector.

7. A method for improving quantum efficiency of a p-i-n photodiode comprising:
   providing an apparent longer absorption length by reflecting incident light from a reflective surface that directs the reflected incident light into and in a parallel direction of a receptor area, thereby, allowing the reflected incident light to travel the length of the receptor area of the photodiode.

8. The method of claim 7 further including providing the receptor area with a top surface and a bottom surface, wherein the top surface is smaller then the bottom surface, and which is surrounded by a reflector which is contiguous with the receptor area in the photodetector itself.

9. A method for filtering and reflecting incident light on a p-i-n photodiode comprising:
   providing reflective surfaces that are angled so that reflected incident light is directed in a parallel direction to the length of a receptor area;
   coating the reflective surfaces with a filtering material that allows reflection of predetermined wavelengths of light; and
   reflecting the predetermined wavelengths of light to the photodiode.

10. A p-i-n photodiode, comprising:
    an n-type layer;
    a p-type layer;
    an intrinsic layer sandwiched between the n-type and p-type layers; and
    means for reflecting light into and parallel with the length of the intrinsic layer.

11. The p-i-n photodiode of claim 10 wherein the means for reflecting light is integrally made with the photodiode and directly reflects the light into a side of the intrinsic layer.

* * * * *